United States Patent
Lee

(10) Patent No.: US 7,526,055 B2
(45) Date of Patent: Apr. 28, 2009

(54) SIGMA-DELTA MODULATOR AND FRACTIONAL-N FREQUENCY SYNTHESIZER COMPRISING SAME

(75) Inventor: Kun-Seok Lee, Bucheon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 890 days.

(21) Appl. No.: 10/718,931

(22) Filed: Nov. 20, 2003

(65) Prior Publication Data

US 2004/0101080 A1 May 27, 2004

(30) Foreign Application Priority Data

Nov. 22, 2002 (KR) ............. 10-2002-0073050

(51) Int. Cl.
 *H03D 3/24* (2006.01)
(52) U.S. Cl. ............... 375/376; 341/143
(58) Field of Classification Search ......... 375/376, 375/373, 371, 354; 341/118, 143
See application file for complete search history.

(56) References Cited

U.S. PATENT DOCUMENTS 6,236,703 B1 * 5/2001 Riley .................. 377/48
6,577,259 B1 * 6/2003 Jelonnek ............ 341/143
6,703,901 B2 * 3/2004 Jovenin et al. ........ 331/1 A
6,980,139 B2 * 12/2005 Doerrer et al. ....... 341/118
2002/0145472 A1 * 10/2002 Oh .................... 331/1 A
2003/0062959 A1 * 4/2003 Tsuda et al. ............ 331/17

FOREIGN PATENT DOCUMENTS

KR  10-0346839  8/2002

* cited by examiner

*Primary Examiner*—Temesghen Ghebretinsae
(74) *Attorney, Agent, or Firm*—F. Chau & Associates, LLC

(57) ABSTRACT

A fractional-N frequency synthesizer including a phase detector, a voltage controlled oscillator, a divider, and a sigma-delta modulator. The phase detector detects a phase difference between a reference signal and a feedback signal. The voltage controlled oscillator receives a phase difference control signal based on the detected phase difference and oscillates a signal with a frequency based on the phase difference. The divider selects a value from at least three integers according to a predetermined selection signal, divides the frequency of the oscillated signal output from the voltage controlled oscillator by the selected value, and outputs a divided signal as a feedback signal to the phase detector. The sigma-delta modulator adds a predetermined input value to an internal feedback value, successively accumulates added values, quantizes the an accumulated value to at least three levels, and converts a quantized value into the predetermined selection signal.

15 Claims, 9 Drawing Sheets

SIGMA-DELTA MODULATOR AND FRACTIONAL-N FREQUENCY SYNTHESIZER COMPRISING SAME

BACKGROUND OF THE INVENTION

1. Technical Field

The present disclosure relates to a sigma-delta ($\Sigma$-$\Delta$) modulator and a fractional-N frequency synthesizer comprising same, and more particularly, to a multi-bit multiple-order interpolative $\Sigma$-$\Delta$ modulator and a fractional-N phase-locked loop (PLL) frequency synthesizer comprising the same.

2. Discussion of the Related Art

PLL frequency synthesizers synthesize desired signals using a reference signal and control a ratio of the synthesized signal to the reference signal using a controller.

PLL frequency synthesizers may employ an integer-N technique and a fractional-N technique. The integer-N technique uses a fixed integer N to divide an output frequency, and the fractional-N technique uses a number N to divide the output frequency which is selected among two or more integers (e.g., N is varied between two or more integers such that the average value of N is fractional). As a result, a divisor is fractional when using the fractional-N technique due to interpolation of each number N selected for every dividing operation.

It may be difficult to meet certain specifications when employing the integer-N technique due to a trade-off between loop bandwidth and channel spacing, while the fractional-N technique alleviates design restrictions on PLLs permitting a broader loop bandwidth while maintaining narrow channel intervals.

The $\Sigma$-$\Delta$ modulator provides a control signal necessary for selecting N in the fractional-N technique.

The $\Sigma$-$\Delta$ modulator may be classified as a multistage-noise-shaping (MASH) $\Sigma$-$\Delta$ modulator and an interpolative $\Sigma$-$\Delta$ modulator. As shown in FIG. 1, a first-order MASH $\Sigma$-$\Delta$ modulator forms an independent loop and is cascaded to another loop in order to construct a high-order modulator. Thus, the high-order modulator can be unconditionally stable and use most of an input range. However, the overall structure of the high-order modulator is complicated. The cascaded first-order modulator causes poor idle-tone characteristics. In order to improve the idle-tone characteristics, each node must vary an output signal of the MASH $\Sigma$-$\Delta$ modulator by using an independent dither that does not affect another node.

When the MASH $\Sigma$-$\Delta$ modulator is a multi-bit modulator, a pass-band gain level of the multi-bit modulator is high, resulting in output value changes over a large range. Accordingly, in a fractional-N frequency synthesizer using the MASH $\Sigma$-$\Delta$ modulator, a non-linear error in a phase/frequency detector increases with an increase of the range of output value changes, thereby greatly limiting the performance of the fractional-N frequency synthesizer.

The interpolative $\Sigma$-$\Delta$ modulator has a structure as shown in FIG. 2. The structure of the interpolative $\Sigma$-$\Delta$ modulator is simpler than that of the MASH $\Sigma$-$\Delta$ modulator. In addition, when the interpolative $\Sigma$-$\Delta$ modulator is used as a multi-bit modulator, the interpolative $\Sigma$-$\Delta$ modulator has a lower pass-band gain level than the MASH $\Sigma$-$\Delta$ modulator, resulting in output value changes over a smaller range than with a MASH $\Sigma$-$\Delta$ modulator.

In consideration of the above, a fractional-N frequency synthesizer using a single-bit $4^{th}$-order $\Sigma$-$\Delta$ modulator has been proposed. The single-bit $4^{th}$-order $\Sigma$-$\Delta$ modulator is not as stable as the MASH $\Sigma$-$\Delta$ modulator and thus guarantees stability over only a limited input range. In other words, a dead band occurs over the full input range. As a result, as shown in FIG. 3, the single-bit $4^{th}$-order $\Sigma$-$\Delta$ modulator uses only 50% of the full input range and maps an output value into N–1 or N+1. This results in 1 bit loss and an increase in quantization noise by 6 dB.

In addition, a quantization noise transfer function of the single-bit $4^{th}$-order $\Sigma$-$\Delta$ modulator functions like a high-pass filter. When the single-bit $4^{th}$-order $\Sigma$-$\Delta$ modulator is of an interpolative type, a pass band gain level must be less than a threshold in order to maintain stability. The pass band gain level is generally adjusted using a Butterworth filter coefficient. Since a total amount of the quantization noise is maintained at a constant level, the threshold in order to maintain stability and a corner frequency of the pass band gain level show a trade-off tendency as seen in FIG. 4. In other words, the pass band gain level increases when the corner frequency increases, and the pass band gain level decreases when the corner frequency decreases.

When $f_s$ is an operation frequency, the maximum corner frequency that guarantees the stability of the single-bit $4^{th}$-order $\Sigma$-$\Delta$ modulator is $0.06(f_s)$. FIGS. 5A and 5B respectively show a quantization noise transfer curve of the single-bit $4^{th}$-order $\Sigma$-$\Delta$ modulator and the output of a PLL with respect to frequency. In FIG. 5B, slanted line 60 denotes out-of-band phase noise of a voltage controlled oscillator (VCO) of the PLL. As can be seen in FIG. 5B, phase noise of the PLL becomes increasingly worse when the frequency approaches the corner frequency of the single-bit $4^{th}$-order $\Sigma$-$\Delta$ modulator.

Lastly, the single-bit $4^{th}$-order $\Sigma$-$\Delta$ modulator without dithering causes unwanted idle-tones. FIG. 6 shows the result of autocorrelation for 2000 outputs of the single-bit $4^{th}$-order $\Sigma$-$\Delta$ modulator. As can be seen in FIG. 6, the autocorrelation results vary within a large range.

Accordingly, there is a need for a $\Sigma$-$\Delta$ modulator and a stable fractional-N frequency synthesizer using the $\Sigma$-$\Delta$ modulator. SUMMARY OF THE INVENTION A fractional-N frequency synthesizer, according to an embodiment of the present invention, includes a phase detector, a voltage controlled oscillator, a divider, and a sigma-delta modulator. The phase detector detects a phase difference between a reference signal and a feedback signal. The voltage controlled oscillator receives a phase difference control signal based on the detected phase difference and oscillates a signal with a frequency based on the detected phase difference. The divider selects a value from at least three integers according to a predetermined selection signal, divides the frequency of the oscillated signal output from the voltage controlled oscillator by the selected value, and outputs a divided signal as a feedback signal to the phase detector. The sigma-delta modulator adds a predetermined input value to an internal feedback value, successively accumulates added values, quantizes the an accumulated value to at least three levels, and converts a quantized value into the predetermined selection signal.

The sigma-delta modulator may include a plurality of operation units for adding the predetermined input value to the internal feedback value and for successively accumulating the added values, a quantizer for quantizing the accumulated value output from a last one of the plurality of operation units to a plurality of bits and for outputting the quantized value as the predetermined selection signal to the divider, and a plurality of multipliers for outputting feedback coefficients as internal feedback values to each of the plurality of operation units, wherein the feedback coefficients are determined according to a quantized level corresponding to the plurality of bits. The feedback coefficients may be symmetrical values spaced at equal intervals around a middle level of the at least three levels. The feedback coefficients may be converted into bit streams with binary values. The fractional-N frequency synthesizer may further include a control signal generator for receiving a plurality of bit values output from the quantizer and for outputting a minimum number of control signals depending on symmetrical values of the bit streams. The control signal generator may include a gray coder for converting the plurality of bit values into a gray code, a plurality of control signal generating units for receiving the gray code and for outputting the control signals, a plurality of inverters for inverting outputs of the plurality of control signal generating units. The multipliers may include connections for outputting the bit streams from the control signals of the control signal generator directly to the plurality of operation units.

A sigma-delta modulator, according to an embodiment of the present invention, includes a plurality of operation units, a quantizer, and a plurality of multipliers. The plurality of operation units add input values to internal feedback values and successively accumulate the added values up to a fourth order. The quantizer quantizes an accumulated value output from a last one of the plurality of operation units into a plurality of bits. The plurality of multipliers output feedback coefficients as internal feedback values to each of the plurality of operation units, wherein the feedback coefficients are determined according to a quantized level corresponding to the plurality of bits.

The feedback coefficients may be symmetrical values spaced at equal intervals around a middle level of a plurality of levels output from the quantizer. The feedback coefficients may be converted into bit streams with binary values. The sigma-delta modulator may further include a control signal generator for receiving a plurality of bit values output from the quantizer and for outputting a minimum number of control signals depending on symmetrical values of the bit streams. The control signal generator may include a gray coder for converting the plurality of bit values into a gray code, a plurality of control signal generating units for receiving the gray code and for outputting the control signals, and a plurality of inverters for inverting outputs of the control signal generating units. The multipliers may include connections for outputting the bit streams from the control signals of the control signal generator directly to the plurality of operation units.

A frequency synthesizer, in accordance with an embodiment of the present invention, includes a phase detector for detecting a phase difference between a reference signal and a feedback signal, a voltage controlled oscillator for receiving a phase difference control signal based on the detected phase difference, and for outputting a signal with a frequency based on the detected phase difference, a divider for selecting a value from a plurality of integers according to a predetermined selection signal, for dividing the frequency of the signal output from the voltage controlled oscillator by the selected value, and for outputting a divided signal as a feedback signal to the phase detector, and a modulator for adding a predetermined input value to an internal feedback value, for successively accumulating added values, for quantizing an accumulated value to a plurality of levels, and for converting a quantized value into the predetermined selection signal.

The modulator may include a plurality of operation units for adding the predetermined input value to the internal feedback value and for successively accumulating the added values, a quantizer for quantizing the accumulated value output from a last one of the plurality of operation units to a plurality of bits and for outputting the quantized value as the predetermined selection signal to the divider, and a plurality of multipliers for outputting feedback coefficients as internal feedback values to each of the plurality of operation units, wherein the feedback coefficients are determined according to a quantized level corresponding to the plurality of bits.

The feedback coefficients may be symmetrical values spaced at equal intervals around a middle level of the plurality of levels.

BRIEF DESCRIPTION OF THE DRAWINGS

Preferred embodiments of the invention can be understood in more detail from the following descriptions taken in conjunction with the accompanying drawings in which.

DETAILED DESCRIPTION OF THE PREFERRED EMBODIMENTS

Preferred embodiments of the present invention will now be described more fully hereinafter below in more detail with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 7:
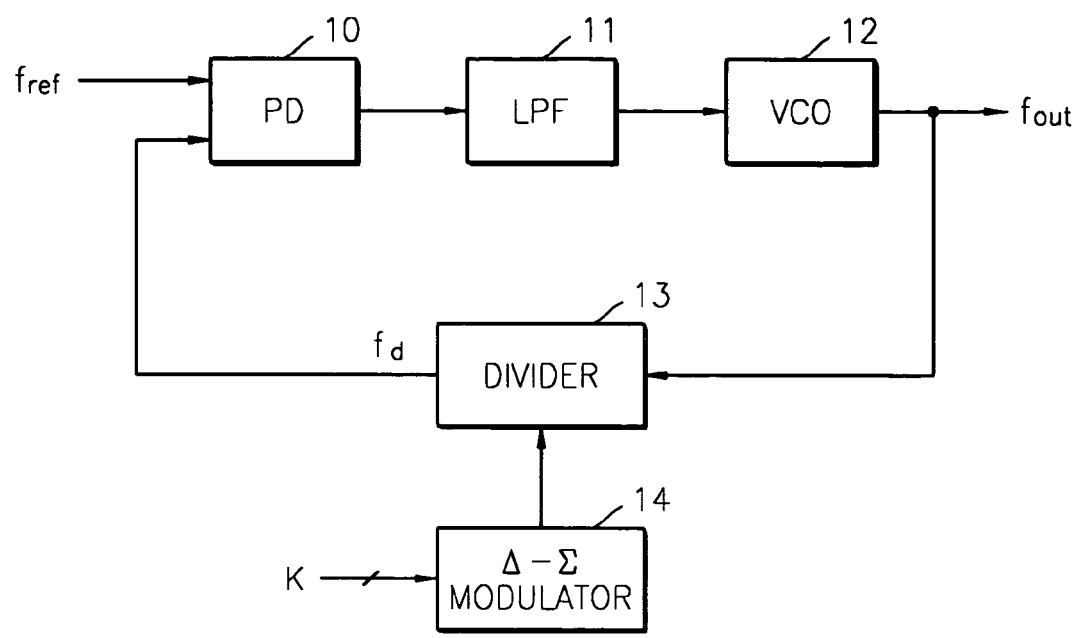
FIG. 7 is a block diagram of a fractional-N frequency synthesizer according to an embodiment of the present invention.

FIG. 7 is a block diagram of a fractional-N frequency synthesizer according to am embodiment of the present invention. Referring to FIG. 7, the fractional-N frequency synthesizer has a feedback loop which divides an output signal $f_{out}$ of the fractional-N frequency synthesizer and then outputs a phase control signal $f_d$. The division of the output signal $f_{out}$ is achieved by a divider 13 and a $\Sigma$-$\Delta$ modulator 14 which controls a division ratio of the divider 13. The divider 13 divides the output signal $f_{out}$ using a value that is selected from three or more integers in accordance with a selection signal output from the $\Sigma$-$\Delta$ modulator 14. It is preferable that the Σ-Δ modulator 14 is a multi-bit multiple-order Σ-Δ modulator, which will be described in connection with FIG. 8A.

The phase control signal $f_d$ is input to a phase detector (PD) 10 and then compared with a reference signal $f_{ref}$. The PD 10 outputs a control signal with a direct current voltage proportional to a phase difference between the phase control signal $f_d$ and the reference signal $f_{ref}$. The control signal passes through a low-pass filter (LPF) 11 and then is input to a voltage controlled oscillator (VCO) 12. The VCO 12 then outputs the output frequency $f_{out}$ according to the control signal input into the VCO 12.

Figure 8A:
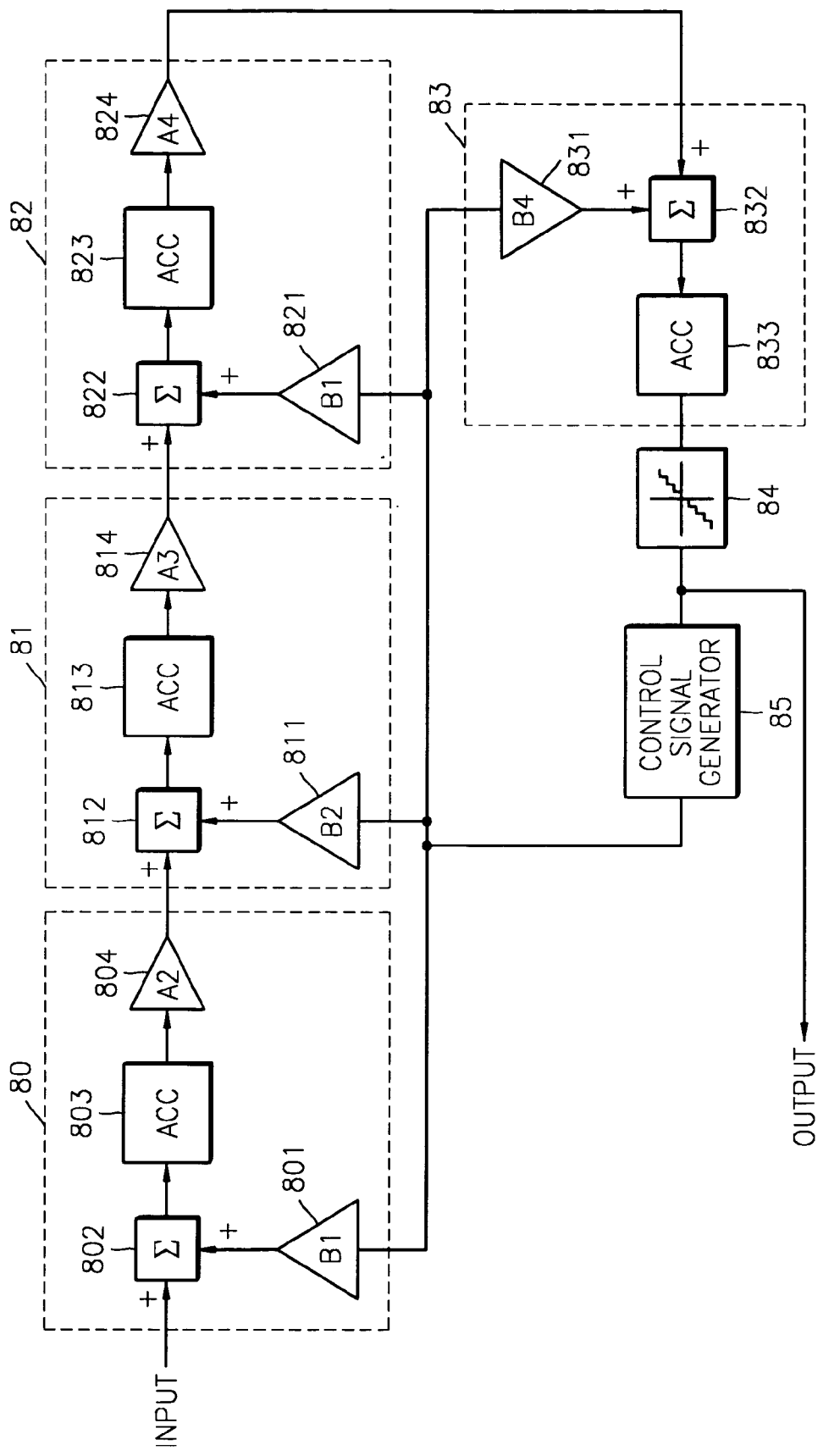
FIG. 8A is a block diagram of a 3-bit $4^{th}$-order $\Sigma$-$\Delta$ modulator according to an embodiment of the present invention.

FIG. 8A is a block diagram of a 3-bit $4^{th}$-order Σ-Δ modulator according to an embodiment of the present invention. Referring to FIG. 8A, the 3-bit $4^{th}$-order Σ-Δ modulator includes a first operation unit 80, a second operation unit 81, a third operation unit 82, a fourth operation unit 83, a 3-bit quantizer 84, and a control signal generator 85. The first operation unit 80 includes a feedback coefficient multiplier 801, an adder 802, an accumulator (ACC) 803, and a dynamic scaling coefficient multiplier 804. The ACC 803 may include an adder (not shown) and a delayer (not shown) which are interconnected. Similarly, the second, third and fourth operation units each include a feedback coefficient multiplier 811, 821 and 831, an adder 812, 822, and 832, and an accumulator (ACC) 813, 823 and 833. The second and third operation units 81 and 82 each include a dynamic scaling coefficient multiplier 814 and 824.

The operation of the 3-bit $4^{th}$-order Σ-Δ modulator will now be explained. The first, second, third, and fourth operation units 80, 81, 82, and 83 perform in a similar manner. Thus, only the behavior of the first operation unit 80 will be described herein. The feedback coefficient multiplier 801 determines one out of 8 feedback coefficients by combining control signals generated from outputs of the 3-bit $4^{th}$-order Σ-Δ modulator and then outputs the determined feedback coefficient to the adder 802. The adder 802 adds the determined feedback coefficient to a frequency control value input within an input range. The ACC 803 accumulates values output from the adder 802, and the dynamic scaling coefficient multiplier 804 multiplies an accumulated value by a dynamic scaling coefficient. The addition and accumulation are also performed in the second, third and fourth operation units 81, 82 and 83. After performing addition and accumulation in the fourth operation unit 83, the 3-bit quantizer 84 quantizes a resulting accumulated value output from the fourth operation unit 83 to a plurality of levels. The quantized value is output to the divider 13 and then output as a selection signal for selecting one from 8 output values ranging from N−3 to N+4. If a 2- or 4-bit quantizer is used, the divider 13 selects 4 or 16 values, i.e., one from $2^n$ values, where n is 2 or 4.

The quantized value is also input to the control signal generator 85, and the control signal generator 85 generates control signals which are provided to the feedback coefficient multipliers 801, 811, 821, and 831 of the first, second, third, and fourth operation units 80, 81, 82, and 83, respectively.

Figure 9:
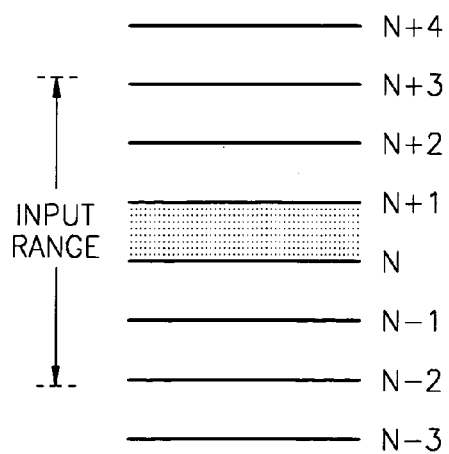
FIG. 9 shows an input range and mapping of output values of the 3-bit $4^{th}$-order $\Sigma$-$\Delta$ modulator shown in FIG. 8A.

With the 3-bit $4^{th}$-order Σ-Δ modulator, the number of output values increases to 8 levels which are mapped from N−3 to N+4 as shown in FIG. 9. Thus, although only ⅛ of the full input range may be used, the output level can be mapped to N or N+1. In addition, quantization noise is attenuated, resulting in a higher corner frequency.

Figure 1:
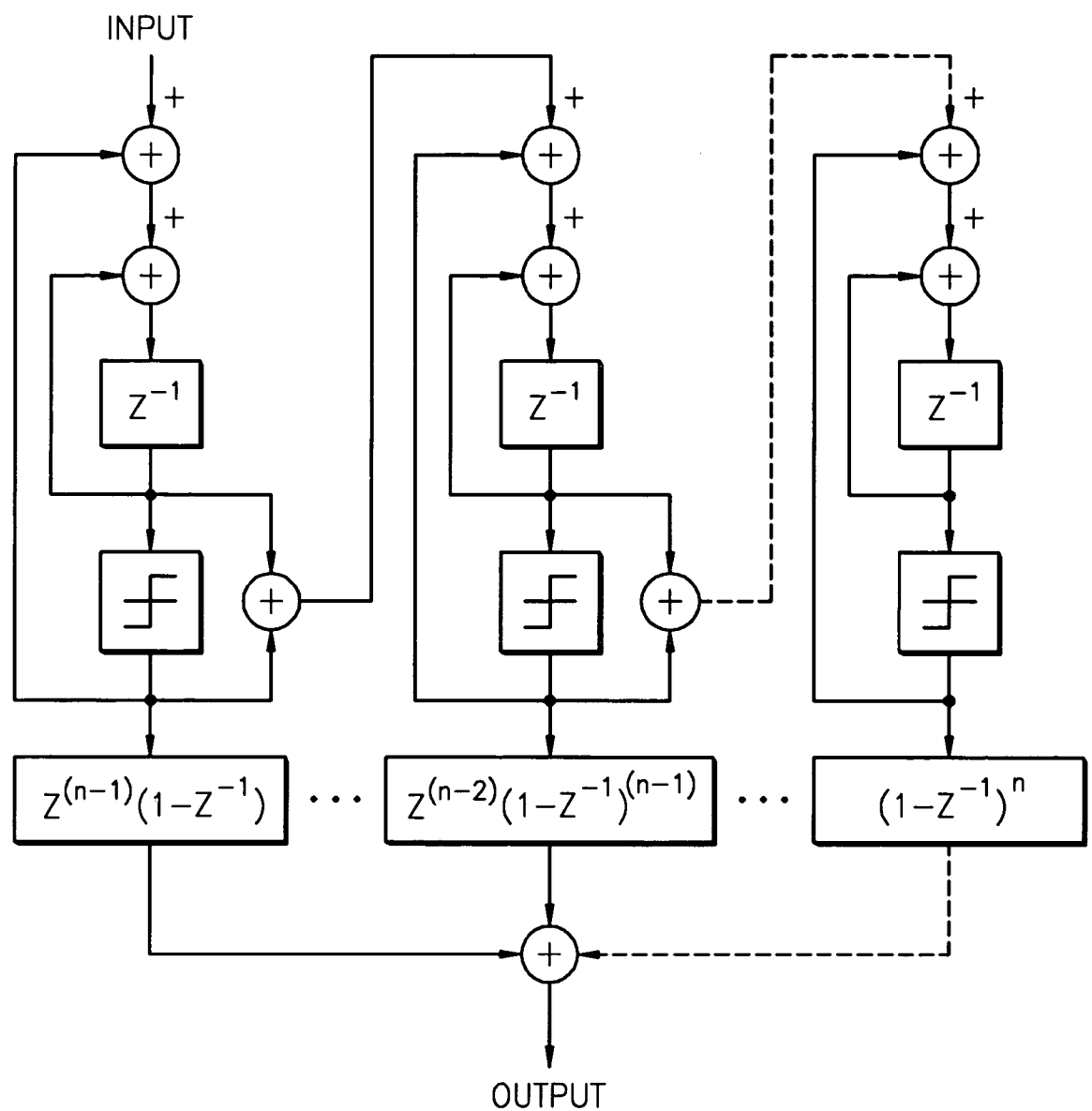
FIG. 1 shows the configuration of a typical MASH $\Sigma$-$\Delta$ modulator.
Figure 2:
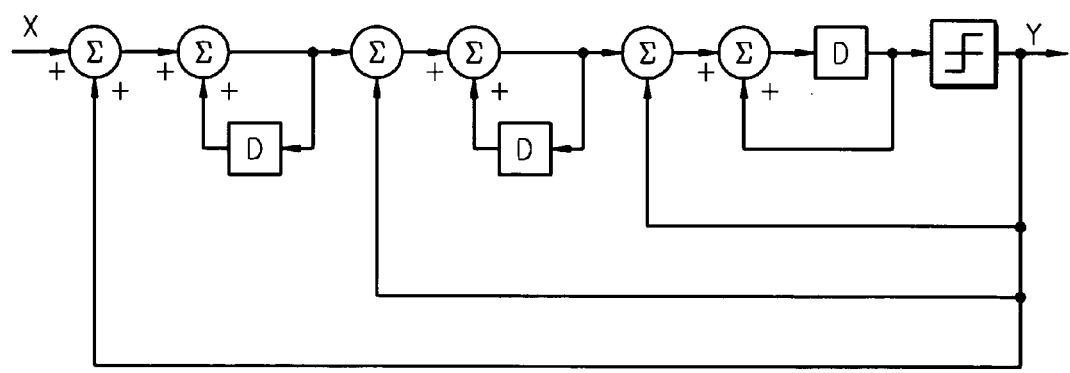
FIG. 2 shows the configuration of a typical interpolative $\Sigma$-$\Delta$ modulator.
Figure 3:
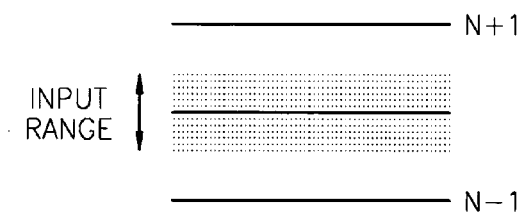
FIG. 3 shows an input range and mapping of output values of a single-bit $4^{th}$-order $\Sigma$-$\Delta$ modulator.
Figure 4:
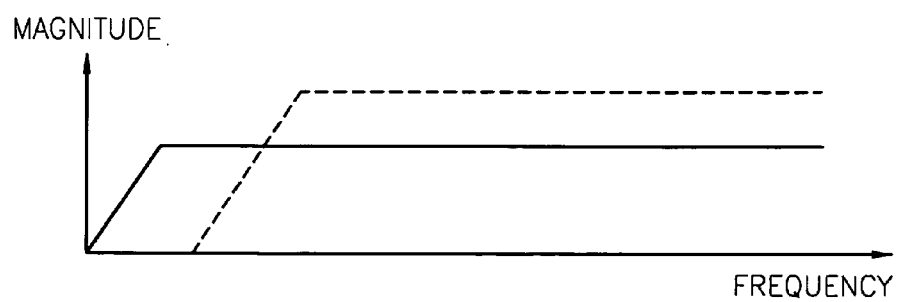
FIG. 4 shows the relationship between a corner frequency for a quantization noise transfer function and a pass band gain level.
Figure 5A:
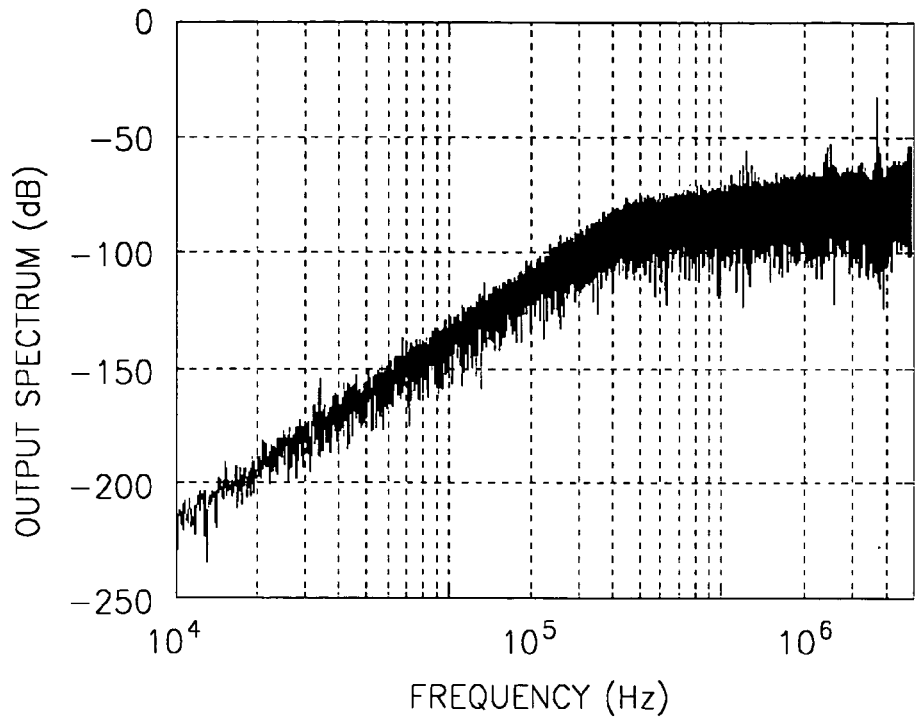
FIG. 5A shows the quantization noise transfer curve of the single-bit $4^{th}$-order $\Sigma$-$\Delta$ modulator referred to in FIG. 3.
Figure 5B:
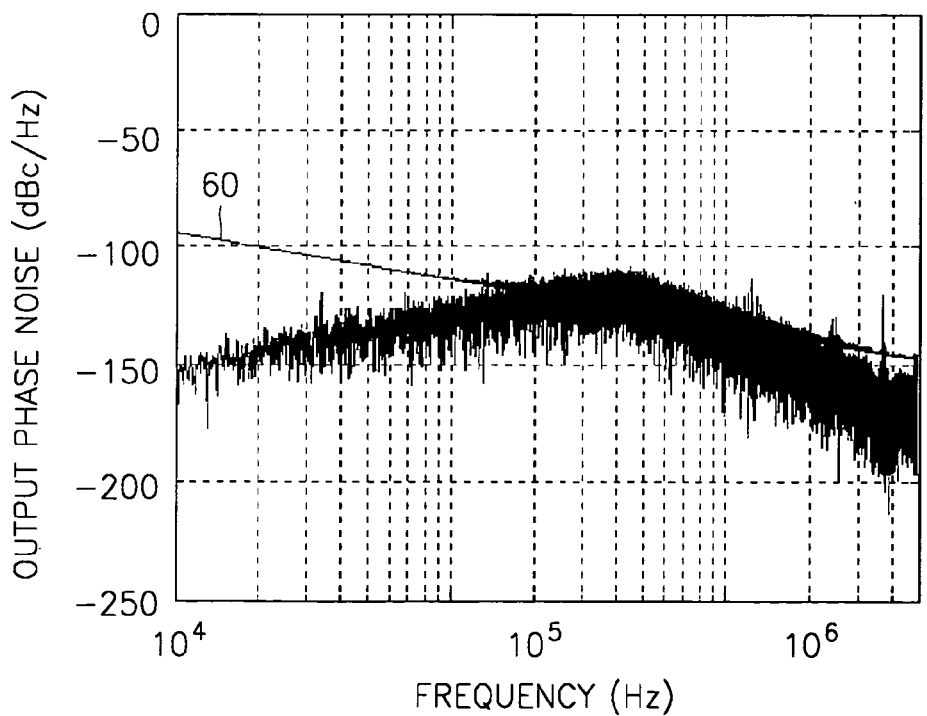
FIG. 5B shows the output phase noise of a PLL of the single-bit $4^{th}$-order $\Sigma$-$\Delta$ modulator referred to in FIG. 3.
Figure 10A:
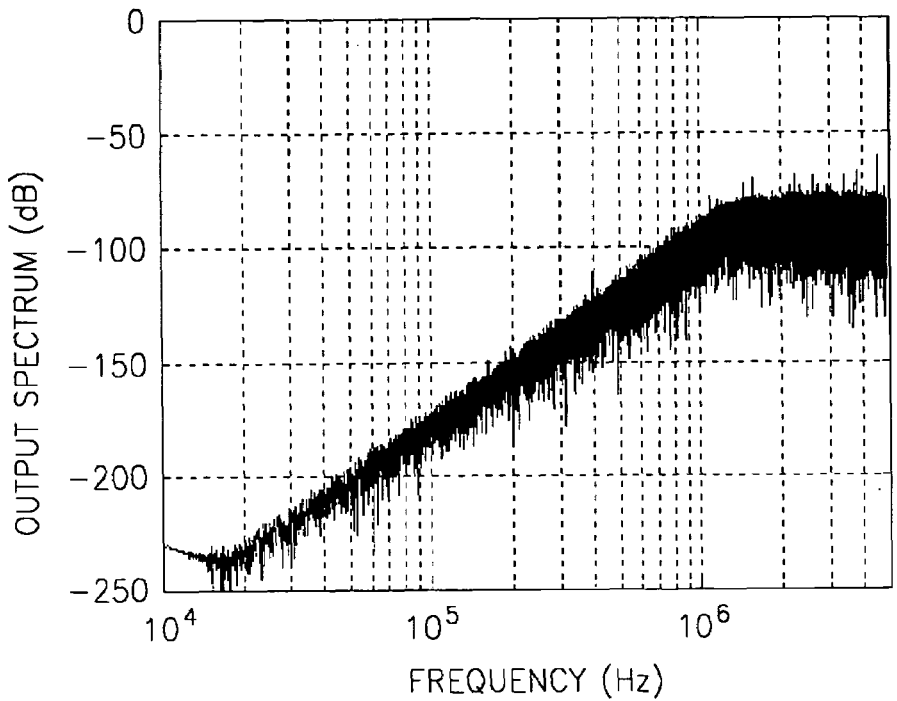
FIG. 10A shows a quantization noise transfer curve of the 3-bit $4^{th}$-order $\Sigma$-$\Delta$ modulator shown in FIG. 8A.
Figure 10B:
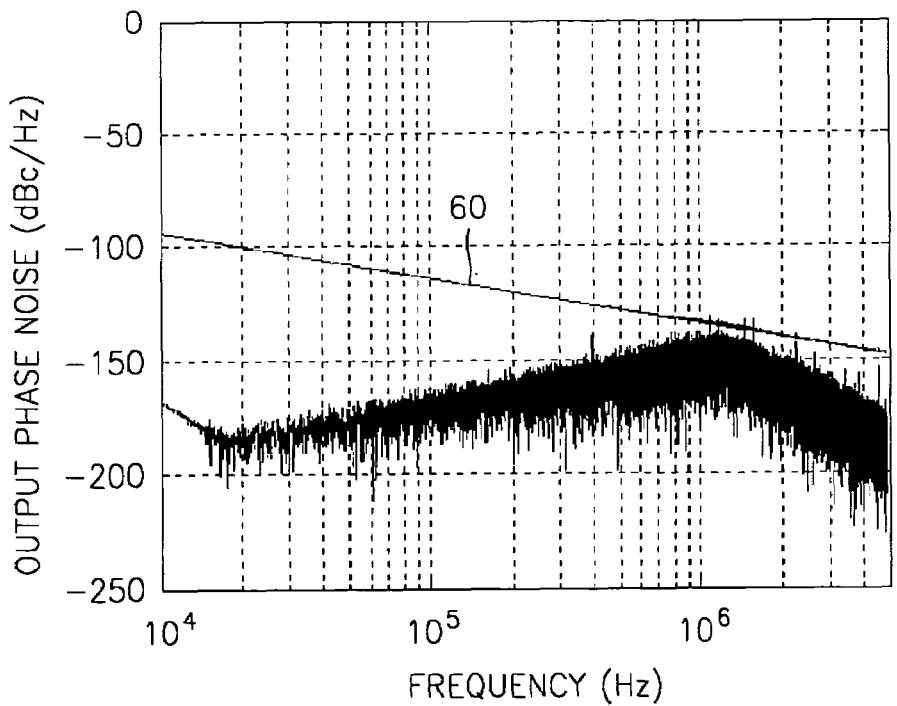
FIG. 10B shows output phase noise of a PLL of the 3-bit $4^{th}$-order $\Sigma$-$\Delta$ modulator shown in FIG. 8A.

Compared to single-bit quantization, 3-bit quantization reduces quantization noise by ⅛. FIG. 10A shows a quantization noise transfer curve of the 3-bit $4^{th}$-order Σ-Δ modulator shown in FIG. 8A. As can be seen in FIG. 10A, the corner frequency of the 3-bit $4^{th}$-order Σ- Δ modulator is increased by double or more from of the single-bit $4^{th}$-order Σ-Δ modulator shown in FIG. 5A. FIG. 10B shows output phase noise of a PLL of the 3-bit $4^{th}$-order Σ-Δ modulator shown in FIG. 8A. Unlike in the single-bit $4^{th}$-order Σ-Δ modulator, phase noise of the PLL of the 3-bit $4^{th}$-order Σ-Δ modulator does not surpass the slanted line 60 denoting out-of-band phase noise, which results in improved out-of-band phase noise characteristics.

Figure 6:
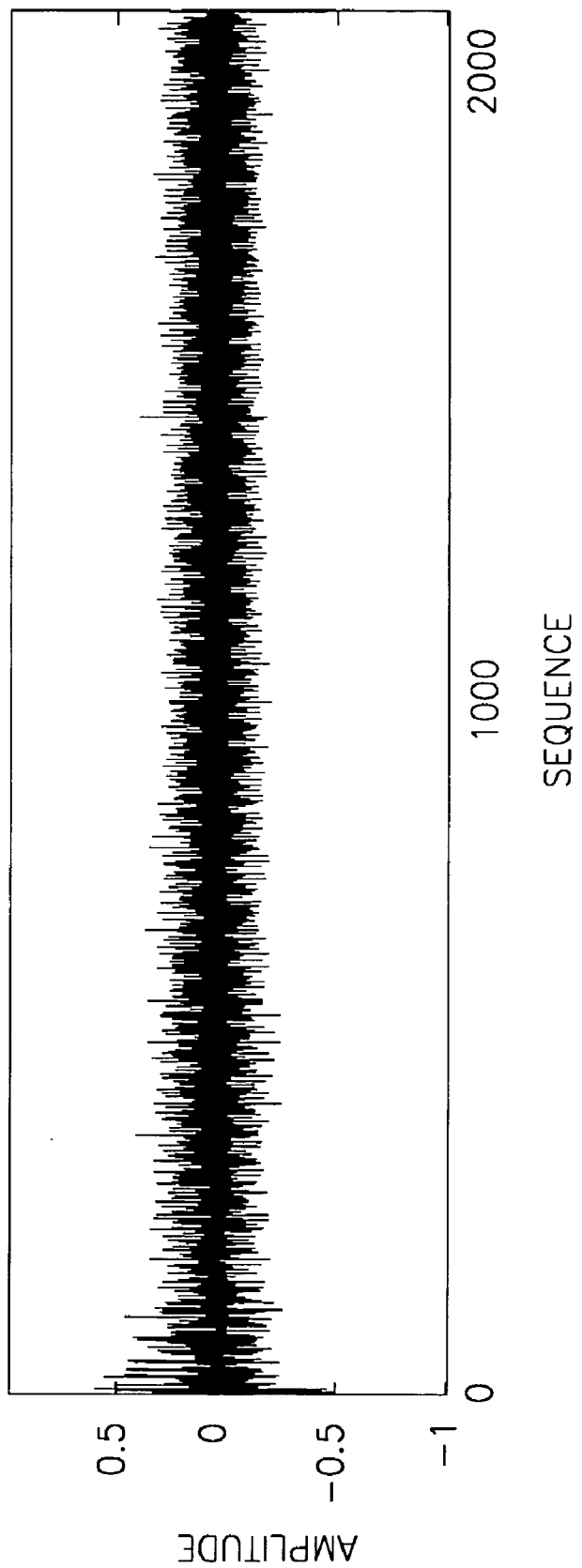
FIG. 6 shows autocorrelation results of the single-bit $4^{th}$-order $\Sigma$-$\Delta$ modulator referred to in FIG. 3.
Figure 11:
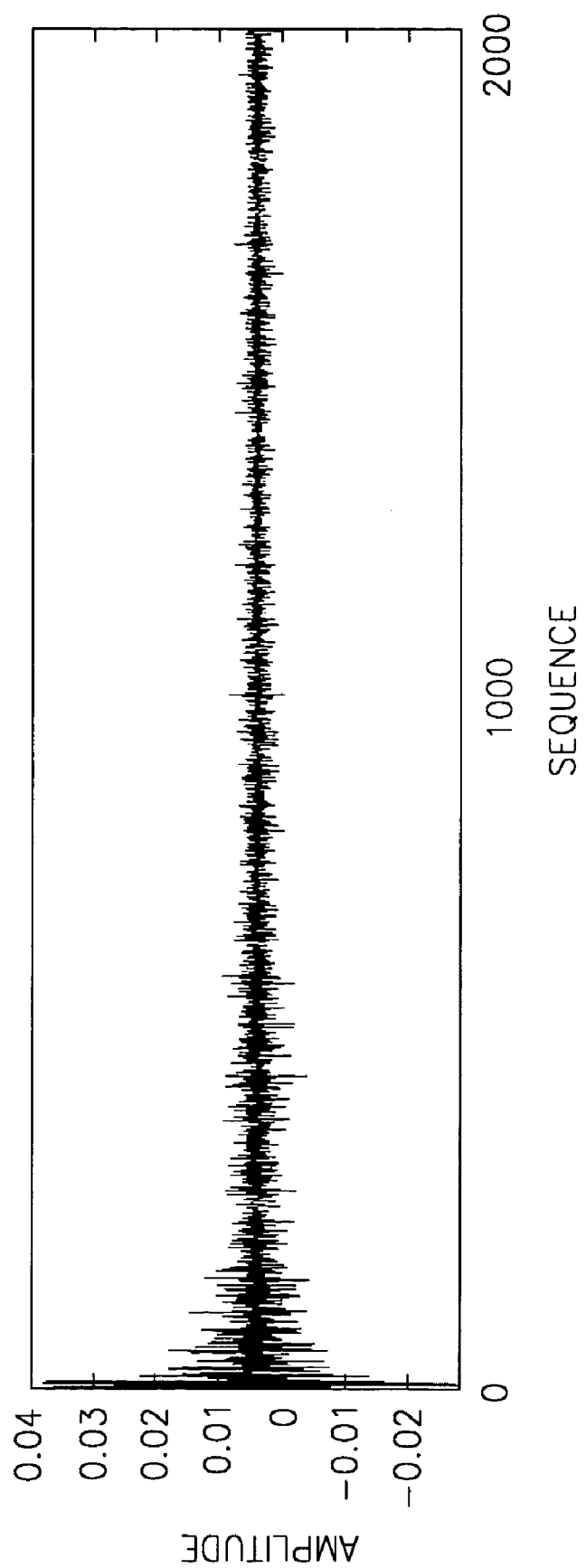
FIG. 11 shows autocorrelation results of the 3-bit $4^{th}$-order $\Sigma$-$\Delta$ modulator shown in FIG. 8A.

Referring to FIG. 11, when compared with the single-bit $4^{th}$-order Σ-Δ modulator, the three-bit $4^{th}$-order Σ-Δ modulator shows improved idle-tone characteristics. FIG. 11 shows the autocorrelation results for 2000 output samples of the 3-bit $4^{th}$-order Σ-Δ modulator. The output range of autocorrelation of the 2000 output samples is reduced to about 1/10 of that shown in FIG. 6.

When constructing the 3-bit $4^{th}$-order Σ-Δ modulator, since scaling coefficients can be generally realized in the form of the square of 2, the dynamic scaling coefficient multipliers 804, 814, and 824 can be realized through simple shifters. Further, as an alternative to using the feedback coefficient multipliers 801, 811, 821, and 831, the feedback coefficients may be stored in a read-only memory (ROM). As a result, whenever necessary, corresponding feedback coefficients can be read from the ROM to be output to adders 802, 812, 822, and 832 of the operation units 80, 81, 82, and 83, respectively. When storing the feedback coefficients in a ROM device, a ROM medium capable of storing 32 coefficients is preferred because, in a case of 3-bit output, the feedback values are input to each of the logic units 80, 81, 82, and 83 over four paths and it can be burdensome to select one coefficient from 8 coefficients. Accordingly, a ROM medium to store 32 coefficients is preferred, and a total capacity of 640 bits of ROM is preferred, while a 20-bit register is used for one coefficient. Thus, multipliers may also be realized through only metallic connections, thereby reducing the amount of hardware used.

Table 1 below shows outputs of the 3-bit quantizer 84, expressed as normalized feedback coefficients at equal intervals (e.g., 0.250) in order to realize the multipliers through only metallic connections.

TABLE 1

| coefficient 1 | 0.875 |
| coefficient 2 | 0.625 |
| coefficient 3 | 0.375 |
| coefficient 4 | 0.125 |
| coefficient 5 | −0.125 |
| coefficient 6 | −0.375 |
| coefficient 7 | −0.625 |
| coefficient 8 | −0.875 |

Table 2 below shows 20-bit feedback coefficient example which may be provided to each operation unit 80, 81, 82 and 83.

| Bit Group | 20 | 19 | 18 | 17 | 16 | 15 | | 5 | 4 | 3 | 2 | 1 |
|---|---|---|---|---|---|---|---|---|---|---|---|---|
| Coefficient 1 | 0 | 0 | 1 | 0 | 1 | 0 | … | 0 | 1 | 0 | 0 | 0 |
| Coefficient 2 | 0 | 0 | 0 | 1 | 1 | 1 | … | 0 | 1 | 0 | 0 | 0 |
| Coefficient 3 | 0 | 0 | 0 | 1 | 0 | 0 | … | 1 | 1 | 0 | 0 | 0 |
| Caefficient 4 | 0 | 0 | 0 | 0 | 0 | 1 | … | 1 | 1 | 0 | 0 | 0 |
| Coefficient 5 | 1 | 1 | 1 | 1 | 1 | 0 | … | 0 | 1 | 0 | 0 | 0 |
| Coeffcient 6 | 1 | 1 | 1 | 0 | 1 | 1 | … | 0 | 1 | 0 | 0 | 0 |
| Coefficient 7 | 1 | 1 | 1 | 0 | 0 | 0 | … | 1 | 1 | 0 | 0 | 0 |
| Coefficient 8 | 1 | 1 | 0 | 1 | 0 | 1 | … | 1 | 1 | 0 | 0 | 0 |

In Table 2, since one feedback coefficient is expressed with 20 bits, $2^{20}$ bit combinations are possible. However, each bit group, which represents 8 feedback coefficients at the same time, is expressed with 8 bits and thus has $2^8$ available bit combinations. In accordance with an embodiment of the present invention, 8 feedback coefficients in each operation unit may be simultaneously expressed through combinations of bit groups and, thereby mimimizing a number of combinable signals of bit groups and the amount of hardware used.

As can be seen in Table 2, first through fourth bit groups each contain coefficients 1 through 8 with equal bit values, and fifth through twelfth bit groups each contain coefficients 1 through 8, in which coefficients 5 through 8 have inverted bit values with respect to bit values of coefficients 4 through 1. The inversion of bit values is due to the expression of feedback coefficients through the conversion of a value output from the 3-bit quantizer 84 into a symmetrical gray code signal. As a result, a number of signals of available bit groups is $2^4$ according to the symmetrical characteristic.

When the above characteristic is realized into hardware, for bit groups with equal bit values, the values of "0" or "1" are connected directly to the adder 802, 812, and 822. For bit groups with inverted bit values, control signals generated from outputs of the 3-bit quantizer 84, which exhibit the inversion characteristic shown in Table 2, are input directly to the adder 802, 812, and 822, respectively, through metallic connections.

When describing the bit groups with inverted bit values, a total of 16 control signals may be generated, of which 8 control signals are inverted with respect to the remaining 8 control signals. Thus, in a case where the control signal generator 85 converts a value output from the 3-bit quantizer 84 into gray code data to make 8 control signals, the feedback coefficient multipliers 801, 811, 821, and 831 can be realized only through metallic connections so that the amount hardware used is minimized. A 3-bit quantizer 84 requires 8 control signals. Alternatively, a 2-bit quantizer requires 2 control signals and a 4-bit quantizer requires 128 control signals.

Figure 8B:
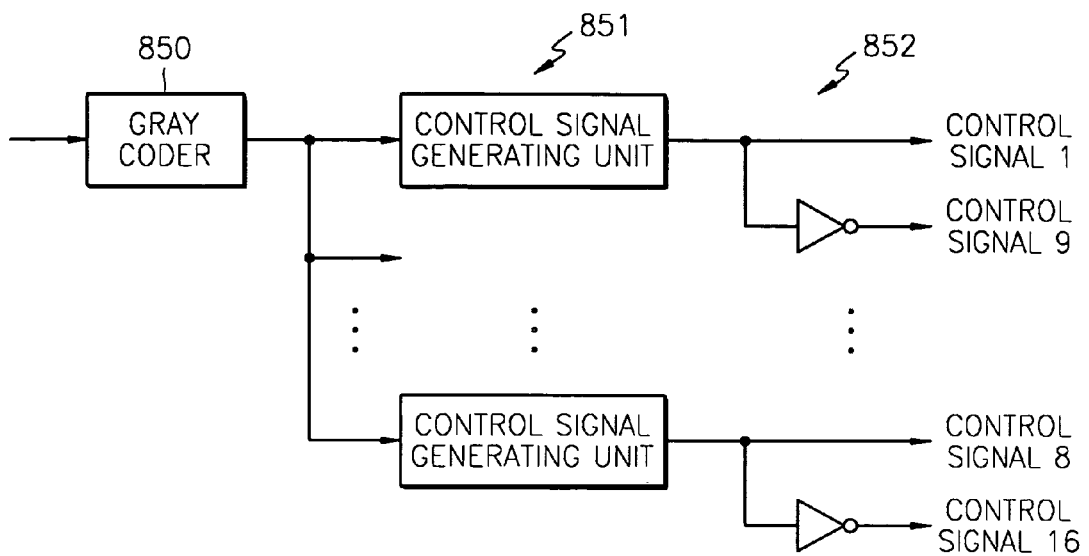
FIG. 8B is a block diagram of a control signal generator shown in FIG. 8A.

FIG. 8B is a block diagram of the control signal generator 85. Referring to FIG. 8B, the control signal generator 85 includes a gray coder 850, a plurality of control signal generating units 851, and a plurality of inverters 852.

The gray coder 850 converts the output from the 3-bit quantizer 84 into the gray code data. Since the control signal generating units 851 include a variety of logic units, such as AND gates and the like, they receive the gray code data, and output a portion of the results as shown in Table 2 via the inverters 852. Accordingly, the control signal generator 85 can generate 8 control signals from a 3-bit output of the 3-bit quantizer 84. In addition, the control signal generator 85 can contribute to the realization of the feedback coefficient multipliers 801, 811, 821, and 831, and the dynamic scaling coefficient multipliers 804, 814, and 824 through only metallic connections by combining the 8 control signals and the inverted signals according to Table 2.

As described above, a single-bit modulator can be configured into a multi-bit modulator. When compared to the single-bit modulator, the multi-bit modulator enables a usable input range to be reduced and output levels to be increased. As a result, only ⅛ of the full input range of the multi-bit modulator is needed to map an output level to N or N+1. In addition, the multi-bit modulator can reduce quantization noise and thus allow a corner frequency to be higher. Moreover, increases in hardware can be minimized by realizing multipliers through only metallic connections.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A fractional-N frequency synthesizer, comprising:
a phase detector for detecting a phase difference between a reference signal and a feedback signal;
a voltage controlled oscillator for receiving a phase difference control signal based on the detected phase difference, and for oscillating a signal with a frequency based on the detected phase difference;
a divider for selecting a value from at least three integers according to a predetermined selection signal, for dividing the frequency of the oscillated signal output from the voltage controlled oscillator by the selected value, and for outputting a divided signal as a feedback signal to the phase detector; and
a sigma-delta modulator for adding a predetermined input value to an internal feedback value, for successively accumulating added values, for quantizing an accumulated value to at least three levels, and for converting a quantized value into the predetermined selection signal, wherein the sigma-delta modulator comprises:
a plurality of operation units for adding the predetermined input value to the internal feedback value and for successively accumulating the added values;
a quantizer for quantizing the accumulated value output from a last one of the plurality of operation units to a plurality of bits; and
a plurality of multipliers for outputting feedback coefficients as internal feedback values to each of the plurality of operation units, wherein the feedback coefficients are determined according to a quantized level corresponding to the plurality of bits and are symmetrical values spaced at equal intervals around a middle level of the at least three levels.

2. The fractional-N frequency synthesizer of claim 1, wherein the quantizer outputs the quantized value as the predetermined selection signal to the divider.

3. The fractional-N frequency synthesizer of claim 1, wherein the feedback coefficients are converted into bit streams with binary values.

4. The fractional-N frequency synthesizer of claim 3, further comprising a control signal generator for receiving a plurality of bit values output from the quantizer and for outputting a minimum number of control signals depending on symmetrical values of the bit streams.

5. The fractional-N frequency synthesizer of claim 4, wherein the control signal generator comprises:
a gray coder for converting the plurality of bit values into a gray code;
a plurality of control signal generating units for receiving the gray code and for outputting the control signals; and
a plurality of inverters for inverting outputs of the plurality of control signal generating units.

6. The fractional-N frequency synthesizer of claim 4, wherein the multipliers include connections for outputting the bit streams from the control signals of the control signal generator directly to the plurality of operation units.

7. The fractional-N frequency synthesizer of claim 5, wherein the multipliers include connections for outputting the bit streams from the control signals of the control signal generator directly to the plurality of operation units.

8. A sigma-delta modulator comprising:
a plurality of operation units for adding input values to internal feedback values and for successively accumulating the added values up to a fourth order;
a multi-bit quantizer for quantizing an accumulated value output from a last one of the plurality of operation units into a plurality of bits; and
a plurality of multipliers for outputting feedback coefficients as internal feedback values to each of the plurality of operation units, wherein the feedback coefficients are determined according to a quantized level corresponding to the plurality of bits and are symmetrical values spaced at equal intervals around a middle level of a plurality of levels output from the quantizer.

9. The sigma-delta modulator of claim 8, wherein the feedback coefficients are converted into bit streams with binary values.

10. The sigma-delta modulator of claim 9, further comprising a control signal generator for receiving a plurality of bit values output from the quantizer and for outputting a minimum number of control signals depending on symmetrical values of the bit streams.

11. The sigma-delta modulator of claim 10, wherein the control signal generator comprises:
a gray coder for converting the plurality of bit values into a gray code;
a plurality of control signal generating units for receiving the gray code and for outputting the control signals; and
a plurality of inverters for inverting outputs of the control signal generating units.

12. The sigma-delta modulator of claim 10, wherein the multipliers include connections for outputting the bit streams from the control signals of the control signal generator directly to the plurality of operation units.

13. The sigma-delta modulator of claim 11, wherein the multipliers include connections for outputting the bit streams from the control signals of the control signal generator directly to the plurality of operation units.

14. A frequency synthesizer, comprising:
a phase detector for detecting a phase difference between a reference signal and a feedback signal;
a voltage controlled oscillator for receiving a phase difference control signal based on the detected phase difference, and for outputting a signal with a frequency based on the detected phase difference;
a divider for selecting a value from a plurality of integers according to a predetermined selection signal, for dividing the frequency of the signal output from the voltage controlled oscillator by the selected value, and for outputting a divided signal as a feedback signal to the phase detector; and
a modulator for adding a predetermined input value to an internal feedback value, for successively accumulating added values, for quantizing an accumulated value to a plurality of levels, and for converting a quantized value into the predetermined selection signal, wherein the modulator comprises:
a plurality of operation units for adding the predetermined input value to the internal feedback value and for successively accumulating the added values;
a quantizer for quantizing the accumulated value output from a last one of the plurality of operation units to a plurality of bits; and
a plurality of multipliers for outputting feedback coefficients as internal feedback values to each of the plurality of operation units, wherein the feedback coefficients are determined according to a quantized level corresponding to the plurality of bits and are symmetrical values spaced at equal intervals around a middle level of the plurality of levels.

15. The frequency synthesizer of claim 14, wherein the quantizer outputs the quantized value as the predetermined selection signal to the divider.

* * * * *